United States Patent [19]

Clark

[11] Patent Number: 5,244,413
[45] Date of Patent: Sep. 14, 1993

[54] RETAINING ARRANGEMENT FOR A CONNECTOR HOUSING

[75] Inventor: Stephen L. Clark, Dillsburg, Pa.

[73] Assignee: E. I. du Pont de Nemours & Co., Wilmington, Del.

[21] Appl. No.: 926,602

[22] Filed: Jul. 31, 1992

[51] Int. Cl.$^5$ .................................. H01R 13/60
[52] U.S. Cl. ................................ 439/567; 439/557
[58] Field of Search ............ 439/552, 557, 558, 571, 439/573, 567

[56] References Cited

U.S. PATENT DOCUMENTS

| | | | |
|---|---|---|---|
| 2,869,098 | 1/1959 | Sauer | 339/75 |
| 3,149,895 | 9/1964 | Bernstein | 339/17 |
| 3,402,384 | 9/1968 | Murakami et al. | 439/557 |
| 3,719,917 | 3/1973 | Fischer et al. | 439/571 X |
| 4,157,856 | 6/1979 | Shevchuk | 339/75 R |
| 4,645,277 | 2/1987 | Kikuchi et al. | 339/17 LM |
| 5,057,031 | 10/1991 | Sinclair | 439/261 |

Primary Examiner—Eugene F. Desmond
Attorney, Agent, or Firm—Woodcock Washburn Kurtz Mackiewicz & Norris

[57] ABSTRACT

A retaining arrangement for securing a housing of a connector to a substrate having a first and a second surface thereon and an opening therethrough includes a spring member connected at one end to the housing having a latching feature at the other end thereof. The spring member is deflectable upon insertion through the opening from a first surface of the substrate to generate a restoring force that acts generally perpendicularly to the substrate to draw the latching feature toward the housing into engagement with the second surface of the substrate.

1 Claim, 5 Drawing Sheets

RETAINING ARRANGEMENT FOR A CONNECTOR HOUSING

BACKGROUND OF THE INVENTION

1. Field of the Invention

The present invention relates to a retaining arrangement for holding a connector housing to a substrate, and in particular, to a retaining arrangement able to accommodate substrates of varying thickness.

2. Description of the Prior Art

In typical practice a connector housing has some form of retaining arrangement for holding the connector in its proper position before it is soldered to conductive tracings provided on the surface of the board. One common form of retaining arrangement includes a retaining head having a latching surface thereon. The head is typically located at the end of a flexible leg. The leg is deflected as it extends through the hole in the board, thus biasing the latching surface on the head into engagement with the undersurface of the board. In other instances the head may be slotted, so that as it passes through the opening it is compressed. Upon clearing the opening the latching surface on the head is biased into engagement with the undersurface of the board. Since the latching surface is located a fixed distance from the undersurface of the connector housing variations in thickness from board to board or variations in the dimensions of the housing may preclude the latching surface from seating firmly against the undersurface of the board.

In view of the foregoing it is believed to be advantageous to provide a retaining arrangement that is able to secure firmly the connector to the substrate during soldering despite variations in board thickness and in housing dimensions.

SUMMARY OF THE INVENTION

The present invention relates to a retaining arrangement for securing a housing of a connector to a substrate without regard to variations in substrate thickness. The substrate has a first and a second surface thereon and an opening therethrough.

The retaining arrangement comprises a spring member having a latching feature at one end thereof. The spring member is connected at its opposite end to the housing. The spring member is deflectable upon insertion through the opening from a first surface thereof to generate a restoring force that acts generally perpendicularly to the substrate to draw the latching feature toward the housing and into engagement with the second surface of the substrate. The housing is thereby securely retained to the substrate regardless of any dimensional variations in the housing and/or the thickness of the substrate.

In one embodiment the spring member comprises at least one flexible cantilevered beam with an integral leg, each of the beam and the leg having a free end thereon. An anchor for connecting the spring member to the housing is disposed at the free end of the beam while the latching feature is disposed at the free end of the leg.

In a variation of this embodiment two cantilevered portions are used. The spring member comprises a flexible beam having a first and a second free end thereon. An integral leg is disposed at each free end of the beam. Each leg has the latching feature thereon. The anchor for connecting the flexible beam to the housing is disposed substantially midway between the first and second ends of the beam, such that the first and second cantilevered portions extend from the anchor point to the ends of the flexible beam.

In still another alternative embodiment the spring member comprises a flexible curved beam with an integral leg. Each of the beam and the leg has a free end thereon. Then anchor is disposed at the free end of the beam while the latching feature is disposed at the free end of the leg. The spring member has an opening therein through which the leg extends.

BRIEF DESCRIPTION OF THE DRAWINGS

The invention will be more fully understood from the following detailed description, taken in accordance with the accompanying drawings, which form a part of this application and in which:

FIGS. 1A and 1B are front elevational and plan views of a retaining arrangement in accordance with a first embodiment of the present invention, while

FIG. 2A is a front elevational view of a variation of the embodiment of the retaining arrangement shown in FIG. 1, while FIG. 3A is a front elevational view of another alternate embodiment of the retaining arrangement in accordance with the present invention, while

DETAILED DESCRIPTION OF THE INVENTION

Figure 1A:
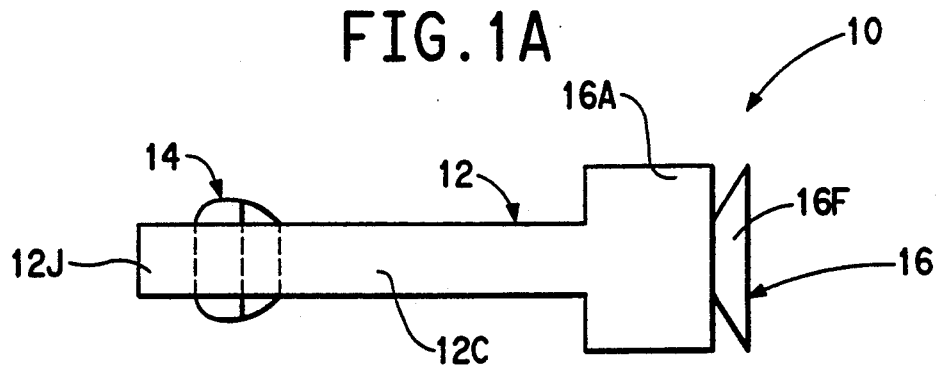

Throughout the following detailed description similar reference numerals refer to similar elements in all Figures of the drawings.

A retaining arrangement in accordance with the present invention for securing a housing H of a connector C to a substrate S is indicated in all Figures hereof by the reference character 10. The housing H has a height dimension h that ranges about some nominal dimension. The substrate S (which in the usual instance takes the form of a printed circuit board) has a first surface $F_1$ and a second surface $F_2$ thereon. The substrate S has a nominal thickness T associated therewith and an opening P passing therethrough. The inside dimension of the opening P is indicated by the reference character $D_P$. The opening P may be plated, it desired. In practice, however, the actual thickness of the substrate may vary within a range about the nominal dimension T.

The retaining arrangement 10 comprises a spring member generally indicated by the reference character 12 having a latching feature 14 thereon. In the preferred instance the latching feature 14 has an enlarged head 14H on which a latching surface 14S is defined. However, the latching feature 14 may take any suitable alternate form. An anchor generally indicated by the reference character 16 serves to connect the spring member 12 to the housing H. The anchor 16 may be implemented in any suitable form, as will be discussed herein.

Figure 1B:
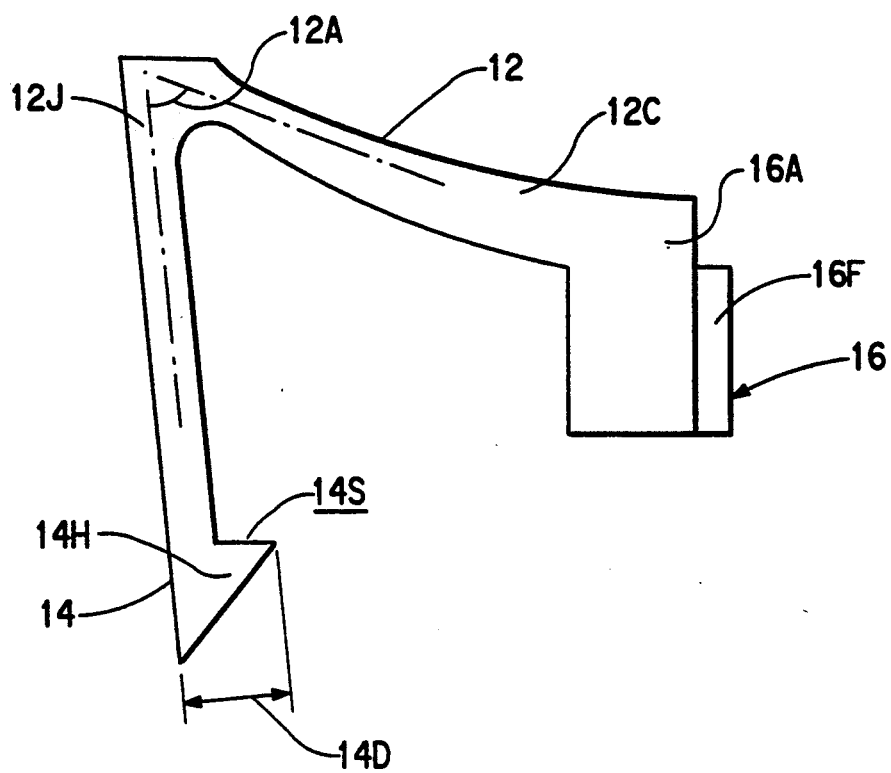

In the embodiment shown in FIGS. 1A and 1B the spring member 12 comprises a flexible cantilevered beam portion 12C joined at a jointure 12J with an integral leg portion 12L. In the form illustrated in these Figures. and axis of the leg portion 12L is inclined at an angle 12A with respect to the axis of the cantilevered beam portion 12C. The angle 12A may be greater than, less than, or equal to ninety degrees, depending upon the circumstances in which the retaining arrangement 10 is being used.

The latching feature 14 is integrally formed at the free end of the leg 12L (i.e., the end of the leg portion 12L opposite the jointure 12J). The latching head 14H has a diametrical, dimension 14D that is slightly smaller than the dimension $D_P$ of the opening P.

Figure 1C:
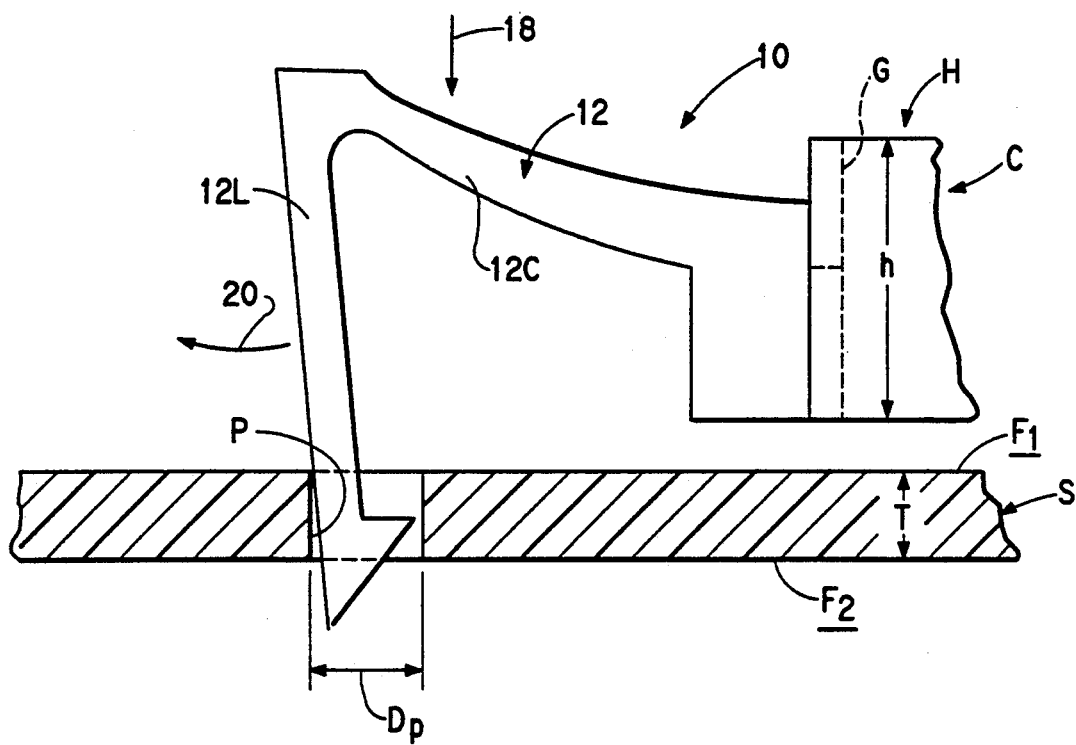
FIGS. 1C and 1D illustrate the retaining arrangement while in use to secure a connector to a substrate.
Figure 1D:
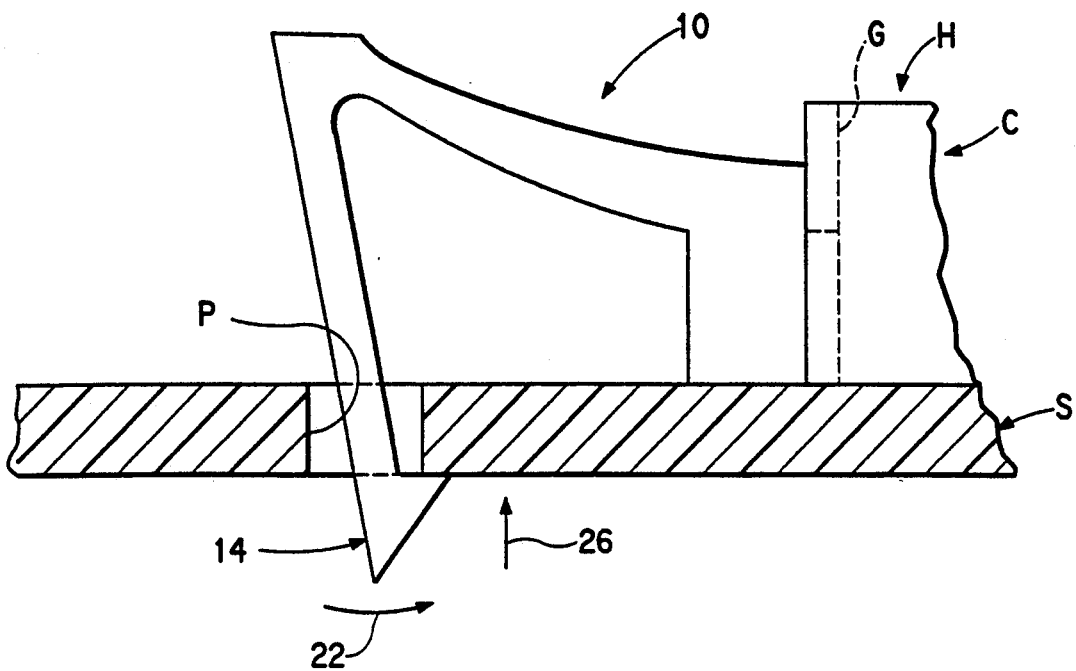

The anchor 16 is integrally connected at the free end of the beam portion 12C (i.e., the end of the beam portion 12B opposite the jointure 12J). In this embodiment the anchor 16 is realized by an enlarged abutment 16A having a dovetailed flange 16F thereon. As is seen from FIG. 1C the flange 16F is accepted in suitable dovetailed grooves G formed on the ends of the housing H.

In use, the retaining arrangement 10, which forms part of the connector housing H, is inserted by the user into the opening P from the first surface $F_1$ of the substrate S by the application of an insertion force acting in the direction 18. The insertion force 18 deflects the cantilevered beam portion 12C of the spring member 12. It will be appreciated that in the embodiment illustrated as the leg 12L enters the opening P the leg 12L is itself biased in the direction 20 by the reaction with the material of the substrate S. When the head 14H clears the opening P the bias force 20 urges the head 14 in the direction 22.

In accordance with this invention the deflection of the cantilevered beam portion 12C generates a restoring force indicated by the arrow 26. The restoring force 26 acts generally perpendicularly to the surfaces $S_1$, $S_2$ of the substrate S to draw the latching surface 14S into engagement with the second surface $S_2$ of the substrate S. As a result the housing H is securely fastened to the substrate S regardless of the actual thickness dimension T of the substrate S and/or the actual height dimension h of the housing H.

Figure 2A:
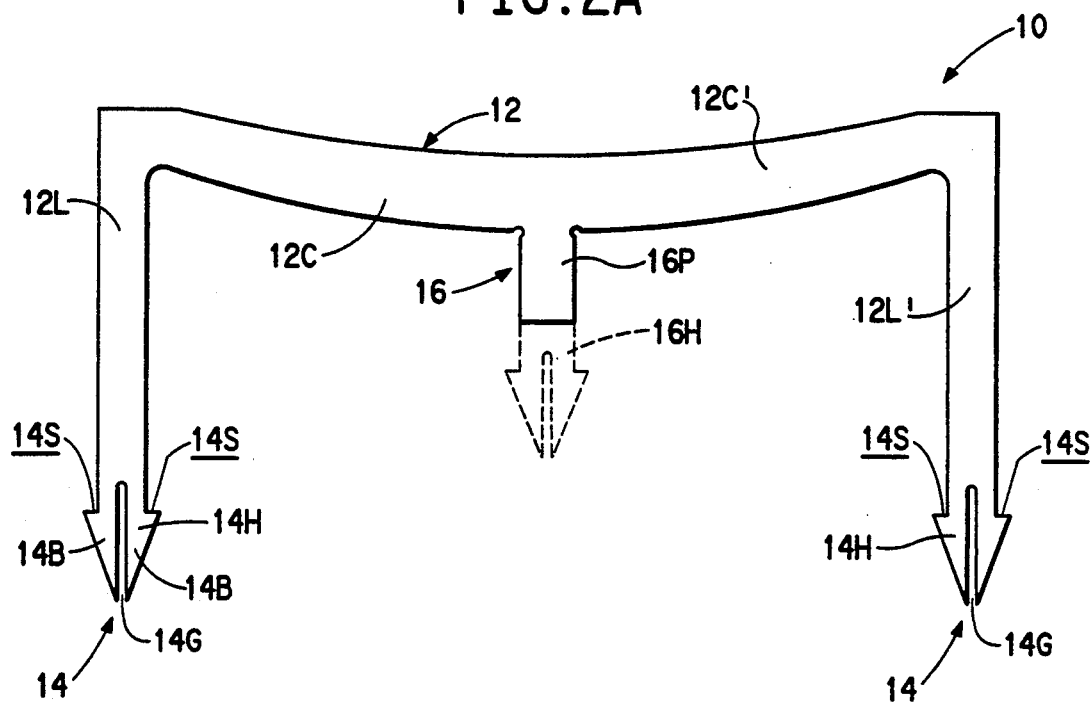
Figure 2B:
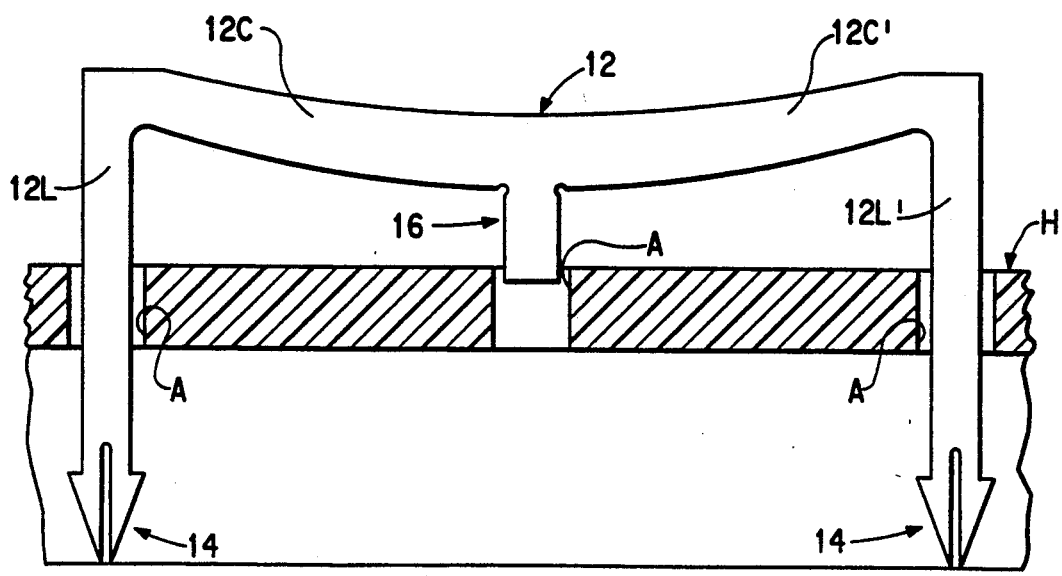
FIGS. 2B through 2D illustrate the retaining arrangement of FIG. 2A while in use to secure a connector to a substrate.

FIG. 2A shows a variation of the embodiment of the retaining arrangement of FIG. 1A in which a second cantilevered beam portion 12C' and a second leg portion 12L' are provided. The cantilevered portions 12C, 12' form an integral flexible beam member having end legs 12L, 12L' integrally disposed at each free end thereof. Each leg 121, 121' has a latching feature 14 thereon. The latching feature 14 in this variation takes the form of an enlarged head 14H having a central axial slot 14G defining lobes 14B. Each lobe 14B has a latching surface 14S thereon. The anchor 16 is disposed substantially midway along the spring member 12. The anchor 16 in this instance takes the form of a peg 16P. The peg 16P may itself exhibit an enlarged slotted head similar to the latching feature, as is illustrated in the dot-dash lines. For reasons that will become manifest the length of the peg 16P should be less than the length of the legs 12L, 12L'. With this variation housing H of the connector C is modified to exhibit an array of mounting apertures A. The anchor peg 16P is received within one of the apertures A while the legs 12L, 12L' extend through respective others of the apertures, as seen in FIG. 2B.

Figure 2C:
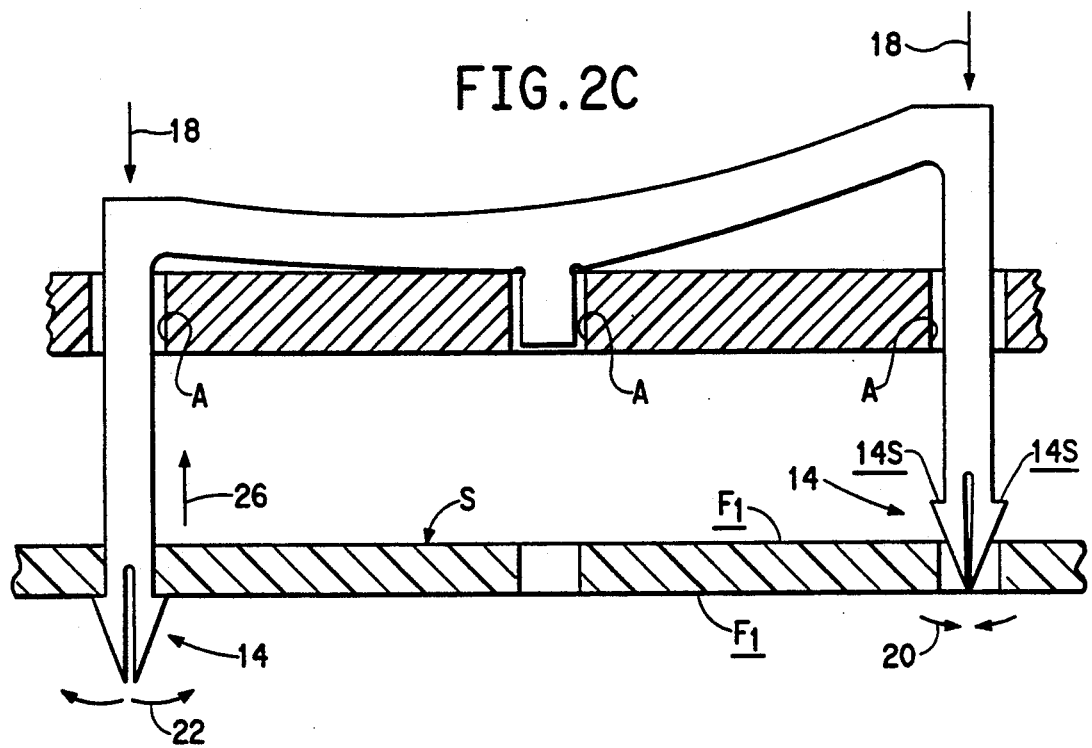
Figure 2D:
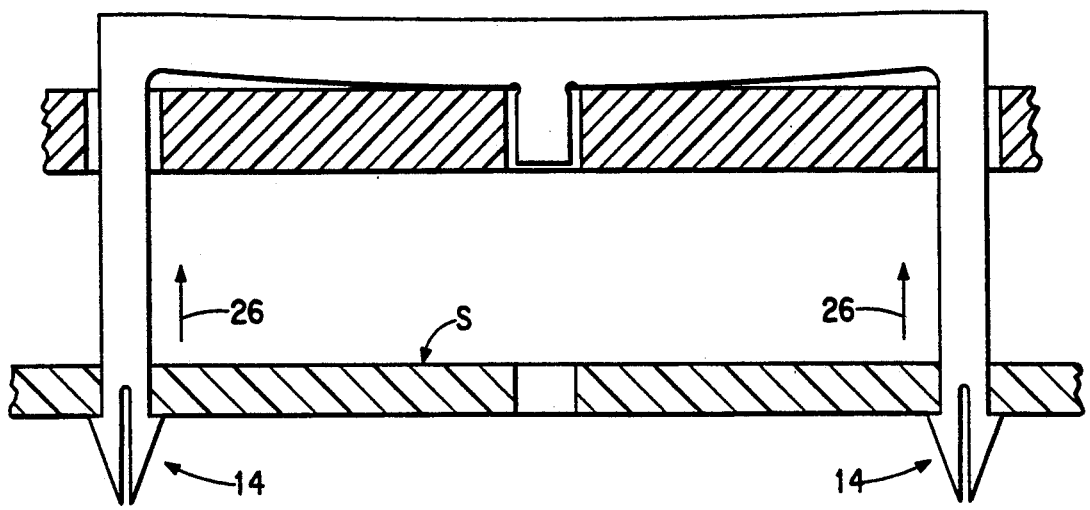

In use, the legs 12L, 12L' are inserted by the user from the first surface $F_1$ of the substrate S into respective openings P provided therein. The insertion force 18 deflects each cantilevered beam portion 12C, 12C' (FIG. 2C). It will be noted that as the latching feature 14 enters the opening P the lobes 14B on the latching feature 14 thereof are compressed toward each other creating the bias force 20 (FIG. 2C). When the feature 14 clears the opening P the bias force 20 urges the lobes 14B in the direction 22 (FIG. 2D). Again, the deflection of the cantilevered beam portion 12C, 12C' generates the restoring force 26 acting generally perpendicularly to the surfaces $S_1$, $S_2$ of the substrate S. As illustrated in FIG. 2D the latching surfaces 14S are drawn by the restoring force 26 into engagement with the second surface $S_2$ of the substrate S. As a result the housing H is securely fastened to the substrate S regardless of the actual dimension T of the substrate S and/or the height dimension h of the housing H.

Figure 3A:
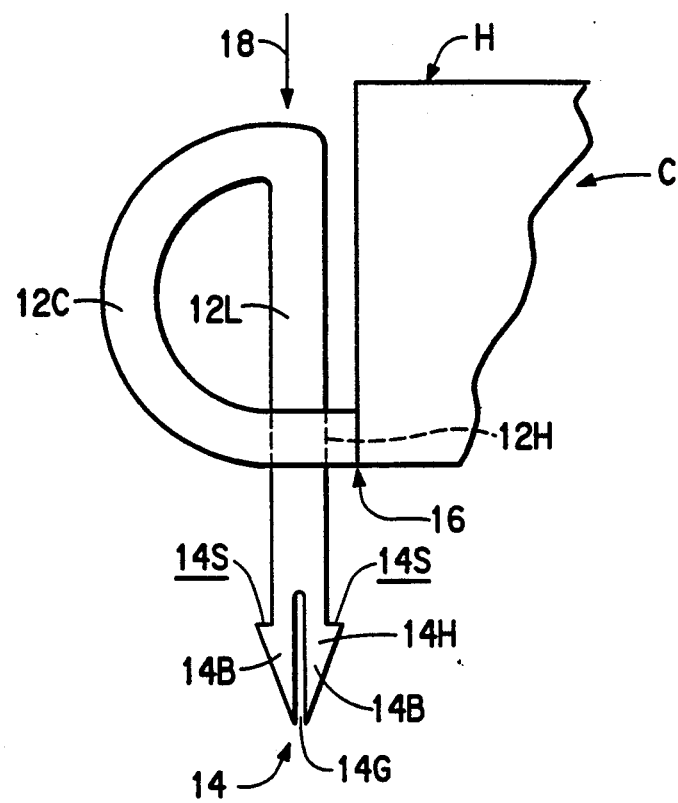
Figure 3B:
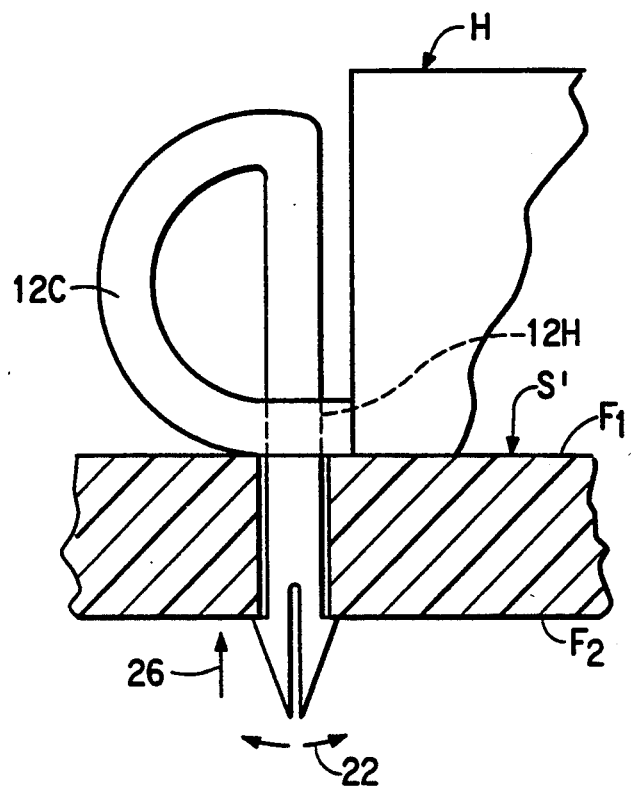
FIG. 3B illustrates the retaining arrangement of FIG. 3A while in use to secure a connector to a substrate.

FIG. 3A shows alternate embodiment of the retaining arrangement of the invention which may find utility in more space-restricted environments. In this embodiment the spring member 12 includes a flexible curved beam portion 12C that bends back on itself. The leg 12L is integrally connected at one end of the curved beam portion 12C and projects through an opening 12H in the curved beam 12C. The other end of the curved beam 12C is integrally formed with the housing H to define the anchor 16.

The operation of the retaining arrangement is identical to that discussed earlier. The deflection of the curved beam portion 12C generates the restoring force 26 that acts generally perpendicularly to the surfaces $F_1$, $F_2$ of the substrate S to draw the latching surface 14S into engagement with the second surface $F_2$ of the substrate S. Regardless of the actual thickness dimension T of the substrate S and/or h of the housing, the housing H is again securely fastened to the substrate S.

In the preferred instance any one of the embodiments or variations of the retaining arrangement hereinabove discussed is fabricated from a resilient plastic material, preferably integrally molded with the housing. It should be understood, however, that the retaining arrangement may be fabricated from stamped metal and attached to the housing H.

Those skilled in the art, having the benefit of the teachings of the present invention as hereinabove set forth may effect numerous modifications thereto. Such modifications as are discussed herein and which appear to those skilled in the art are to be construed as lying within the scope of the present invention, as defined by the appended claims.

What is claimed is:

1. A retaining arrangement for securing a housing of a connector to a substrate having a first and a second surface thereon and an opening therethrough, the retaining arrangement comprising:

a spring member having a latching feature thereon, the spring member being connected to the housing, the spring member being deflectable upon insertion through the opening from a first surface of the substrate to generate a restoring force acting generally perpendicularly to the substrate to draw the latching feature into engagement with the second surface of the substrate, wherein the spring member comprises a flexible curved beam and an integral leg, each of the beam and the leg having an end thereon, an anchor for connecting the spring member to the housing being disposed at the end of the beam while the latching feature is disposed at the end of the leg, the spring member having an opening therein through which the leg extends.

* * * * *